(12) United States Patent
Adachi et al.

(10) Patent No.: US 8,900,933 B2
(45) Date of Patent: Dec. 2, 2014

(54) SEMICONDUCTOR MODULE, MOLDING APPARATUS, AND MOLDING METHOD

(75) Inventors: Shuuji Adachi, Tokyo (JP); Fumiyuki Komiyama, Yokohama (JP); Shuuji Kobayashi, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 36 days.

(21) Appl. No.: 13/822,265

(22) PCT Filed: Nov. 10, 2011

(86) PCT No.: PCT/JP2011/075909
§ 371 (c)(1),
(2), (4) Date: Mar. 11, 2013

(87) PCT Pub. No.: WO2012/090594
PCT Pub. Date: Jul. 5, 2012

(65) Prior Publication Data
US 2013/0178018 A1    Jul. 11, 2013

(30) Foreign Application Priority Data
Dec. 27, 2010   (JP) ................. 2010-290295

(51) Int. Cl.
| | |
|---|---|
| H01L 21/00 | (2006.01) |
| H01L 23/00 | (2006.01) |
| H01L 21/67 | (2006.01) |
| B29C 45/14 | (2006.01) |
| H01L 25/07 | (2006.01) |
| H01L 21/56 | (2006.01) |
| B29C 45/37 | (2006.01) |
| H01L 25/00 | (2006.01) |

(52) U.S. Cl.
CPC .......... *H01L 21/67126* (2013.01); *H01L 24/33* (2013.01); *B29C 45/14655* (2013.01); *H01L 25/072* (2013.01); *H01L 21/565* (2013.01); *B29C 45/37* (2013.01); *H01L 25/50* (2013.01); *B29C 45/14418* (2013.01)
USPC .......................................... 438/127; 438/124

(58) Field of Classification Search
None
See application file for complete search history.

(56) References Cited

U.S. PATENT DOCUMENTS

| | | | | |
|---|---|---|---|---|
| 5,955,021 | A  * | 9/1999 | Tiffany, III ............... | 264/272.11 |
| 7,731,871 | B2 * | 6/2010 | Inoue ............................ | 264/1.33 |
| 8,158,048 | B2 * | 4/2012 | Ohashi et al. ................. | 264/293 |
| 2002/0093120 | A1* | 7/2002 | Magni et al. ............. | 264/272.15 |
| 2010/0166906 | A1* | 7/2010 | Hashimoto et al. ........... | 425/385 |
| 2012/0205038 | A1* | 8/2012 | Sumi et al. ............... | 156/244.11 |
| 2013/0178018 | A1* | 7/2013 | Adachi et al. ................. | 438/127 |

FOREIGN PATENT DOCUMENTS

| | | |
|---|---|---|
| JP | 2000-294727 A | 10/2000 |
| JP | 2004-096004 A | 3/2004 |
| JP | 2004-303900 A | 10/2004 |
| JP | 2005-136332 A | 5/2005 |
| JP | 2006-086499 A | 3/2006 |
| JP | 2007-320102 A | 12/2007 |

\* cited by examiner

*Primary Examiner* — Scott B Geyer
*Assistant Examiner* — Evren Seven
(74) *Attorney, Agent, or Firm* — Foley & Lardner LLP

(57) ABSTRACT

A semiconductor module includes a plurality of semiconductor elements, a first tabular electrode coupled to one face side of the plurality of semiconductor elements, a second tabular electrode coupled to the other face side of the plurality of semiconductor elements, and a molding material that encapsulates the plurality of semiconductor elements between the first electrode and the second electrode. A protrusion extending toward the second electrode is provided in a circumferential edge portion of the first electrode, and the protrusion surrounds the molding material.

1 Claim, 9 Drawing Sheets

SEMICONDUCTOR MODULE, MOLDING APPARATUS, AND MOLDING METHOD

TECHNICAL FIELD

The present invention relates to a molding apparatus and a molding method for molding a molding target such as a semiconductor module or a semiconductor device using a molding member, in which leakage of a molding material can be prevented.

BACKGROUND ART

There is known an apparatus in which a sliding member 30 movable in a closing/opening direction (vertical direction) relative to a molding target inside a molding chamber has a backplate member 31 and a swivel member 32, a single convex portion 33 is provided substantially in the center of the lower face of the backplate member 31, and springs 34 are arranged around the convex portion 33 (refer to JP 2007-320102A). In this apparatus, the swivel member 32 may be inclined in any direction within a certain angle range with respect to a horizontal plane by using the convex portion 33 as a center. For this reason, even when an upper face of the molding target is not horizontal but inclined, the swivel member (32) is inclined along the upper face of the molding target so as to make contact with the molding target without a gap.

SUMMARY OF THE INVENTION

However, in the technique disclosed in JP 2007-320102A, a gap for allowing for inclination of the swivel member 32 exists between the backplate member 31 and the swivel member 32. Therefore, there is a problem in that resin may leak from this gap.

The present invention provides a technology for preventing resin leakage even when there is an inclination deviation between both faces of the molding target.

A semiconductor module of the present invention comprises a plurality of semiconductor elements, a first tabular electrode coupled to one face side of the plurality of semiconductor elements, a second tabular electrode coupled to the other face side of the plurality of semiconductor elements, and a molding material that encapsulates the plurality of semiconductor elements between the first electrode and the second electrode. A protrusion extending toward the second electrode is provided in a circumferential edge portion of the first electrode, and the protrusion surrounds the molding material.

BRIEF DESCRIPTION OF THE DRAWINGS

The foregoing and additional features and characteristics of this disclosure will become more apparent from the following detailed description considered with the reference to the accompanying drawings, wherein.

DESCRIPTION OF THE EMBODIMENTS

Hereinafter, embodiments of the present invention will be described with reference to the accompanying drawings. The present embodiment is provided to apply the present invention to a molding apparatus that molds an electronic circuit including a power element and a semiconductor device having electrodes arranged on both sides with resin to manufacture a semiconductor device (semiconductor module).

First Embodiment

Figure 1:
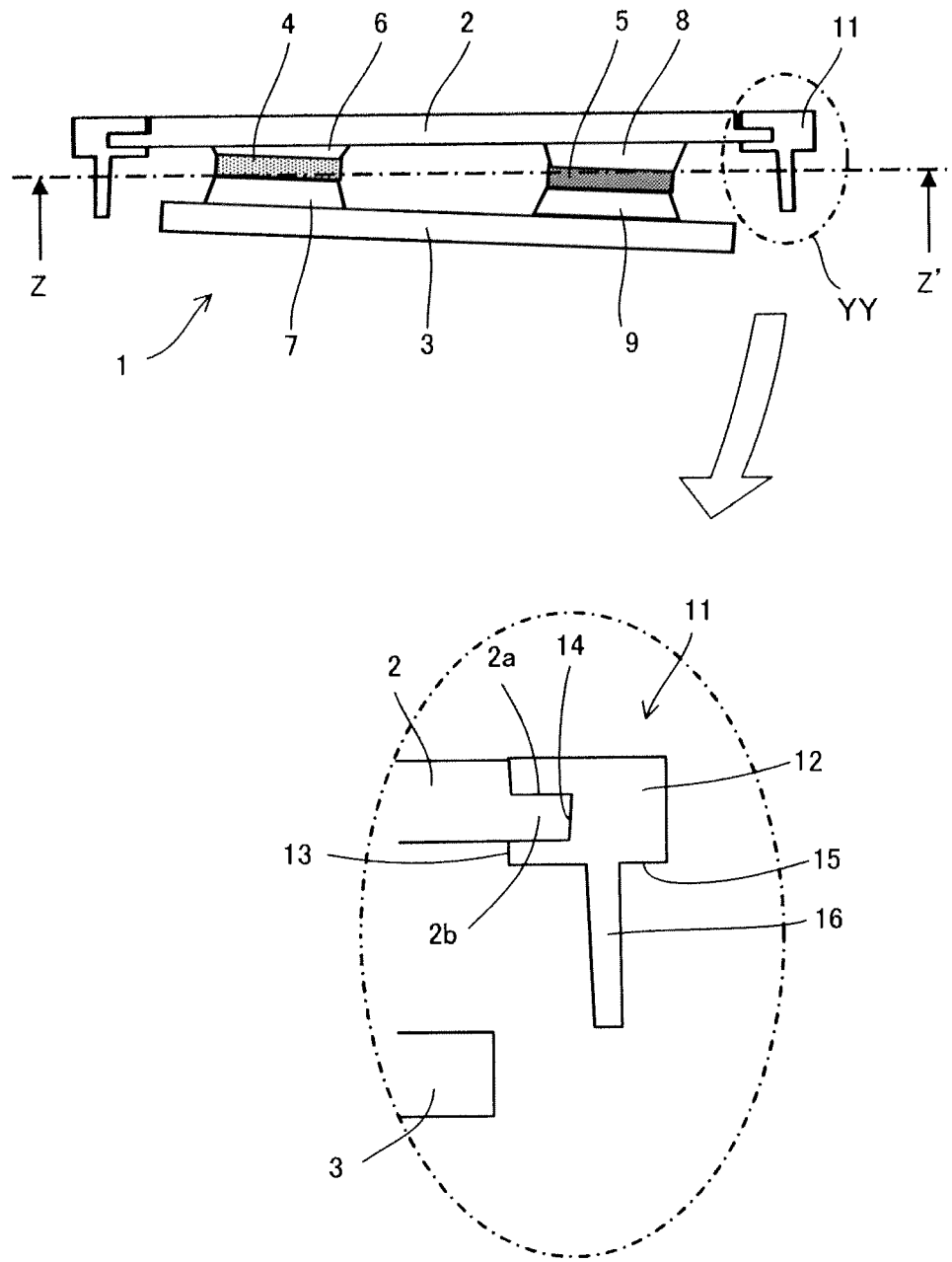
FIG. 1 is a schematic longitudinal cross-sectional view illustrating a semiconductor device according to a first embodiment.
Figure 2:
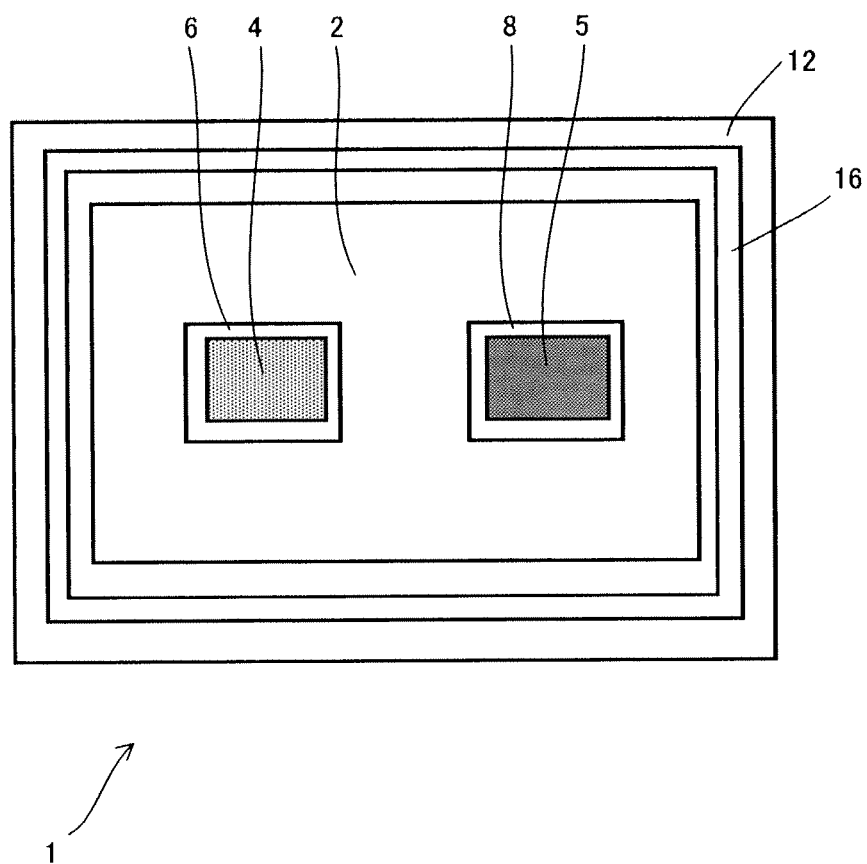
FIG. 2 is a cross-sectional view taken along a line Z-Z' of the semiconductor device of FIG. 1.

FIG. 1 is a schematic longitudinal cross-sectional view illustrating a semiconductor device 1 (semiconductor module) as a molding target, and FIG. 2 is a cross-sectional view taken along a line Z-Z' of the semiconductor device 1 of FIG. 1. In FIG. 1, an enlarged view of the YY-portion circled by a one-dotted chain line is illustrated in the lower half.

As illustrated in FIG. 1, the semiconductor device 1 includes double-sided cooling type power elements 4 and 5, such as a transistor or a power takeoff (PTO) element, whose both upper and lower faces are provided with electrodes 2 and 3, respectively. In other words, the power elements 4 and 5 are interposed between a pair of the electrodes 2 and 3.

In the power elements 4 and 5, for example, a positive terminal is provided in a vertically upward side, and a negative terminal is provided in a vertically downward side. The positive terminals of the power elements 4 and 5 are connected to the electrode 2 (hereinafter, referred to as an "upper electrode") provided in a vertically upward side through solder portions 6 and 8. In addition, the negative terminals of the power elements 4 and 5 are connected to the electrode 3 (hereinafter, referred to as a "lower electrode") provided in a vertically downward side through solder portions 7 and 9.

In FIG. 1, while the upper electrode 2 of the semiconductor device 1 is positioned horizontally, the lower electrode 3 is vertically upwardly lifted in the left side. In other words, a vertical thickness between a right end of an upper face 2a of the upper electrode 2 and a right end of a lower face 3a of the lower electrode 3 is greater than a vertical thickness between a left end of an upper face 2a of the upper electrode 2 and a left end of a lower face 3a of the lower electrode 3. That is, an inclination deviation is generated between the upper and lower faces of the semiconductor device 1.

For cooling the power elements 4 and 5, a pair of rectangular tabular electrodes 2 and 3 having a predetermined area are formed as illustrated in FIG. 2. By causing a pair of the electrodes 2 and 3 to make contact with a cooler from the upper and lower sides, it is possible to cool the entire semiconductor device 1 through the electrodes 2 and 3.

A gap (vertical gap) between the upper and lower electrodes 2 and 3 has a narrow pitch of, for example, several hundreds of micrometers, which may generate an electric discharge between side faces of the power elements 4 and 5 or between the upper and lower electrodes 2 and 3. Therefore, it is necessary to insert an insulation material into the gap (space) between the upper and lower electrodes 2 and 3. In addition, in the semiconductor device 1, a plurality of power elements 4 and 5 interposed between the electrodes 2 and 3 have different vertical thicknesses. For this reason, in addition to the inclination deviation caused by deteriorated parallelism between the upper and lower electrodes 2 and 3, a deviation is also generated in the vertical thickness across the entire semiconductor device 1 including the upper and lower electrodes 2 and 3.

Even in the semiconductor device 1 having an inclination deviation or a thickness deviation as described above, in order to perform molding by using resin as an insulation material for the gap (space) between the upper and lower electrodes 2 and 3, a plastically deformable lining member 11 is provided to surround a circumferential edge of the upper electrode 2 according to the present embodiment.

As illustrated in the enlarged view in the lower half of FIG. 1, the lining member 11 includes a frame 12, a trench 14, and a protrusion 16. An inner circumferential side face 13 of the frame 12 is provided with a horizontal trench 14. Meanwhile, an upper side of the outer circumference of the upper electrode 2 is provided with a notch 2a to form a protrusion 2b protruding to the outer side in a horizontal direction. For this reason, as the protrusion 2b of the upper electrode 2 is fitted to the trench 14 of the frame 12, the frame 12 is supported by the circumferential edge of the upper electrode 2. In other words, the entire semiconductor device 1 including the upper electrode 2 is supported by the frame 12.

The lower face 15 of the frame 12 is provided with a protrusion 16 protruding (extending) vertically downwardly. This protrusion 16 also surrounds the circumferential edge of the upper electrode 2 as illustrated in FIG. 2.

Any material may be used for the lining member 11 including the protrusion 16 if it can be plastically deformed without breaking. For example, thermosetting resin such as polyphenylene sulfide (PPS) may be employed. In the case of employing PPS resin, heating is not necessary for plastic deformation. The protrusion 16 may be plastically deformed by adding a force in a mold closing direction toward the protrusion 16 of the lining member 11 when mold closing is performed by storing the semiconductor device 1 in the molding chamber of the molding apparatus. In addition, it is not necessary to use a material capable of plastically deforming the entire lining member 11. A material capable of plastically deforming at least the protrusion 16 may be used.

Meanwhile, an elastically deformable material is not suitable for the protrusion 16 because the protrusion 16 subjected to resin curing may return to its original state in which elastic deformation has not occurred, and the resin may be exfoliated from the semiconductor device 1 even when the resin is injected into the gap of the semiconductor device 1 while the protrusion 16 is elastically deformed.

Figure 3:
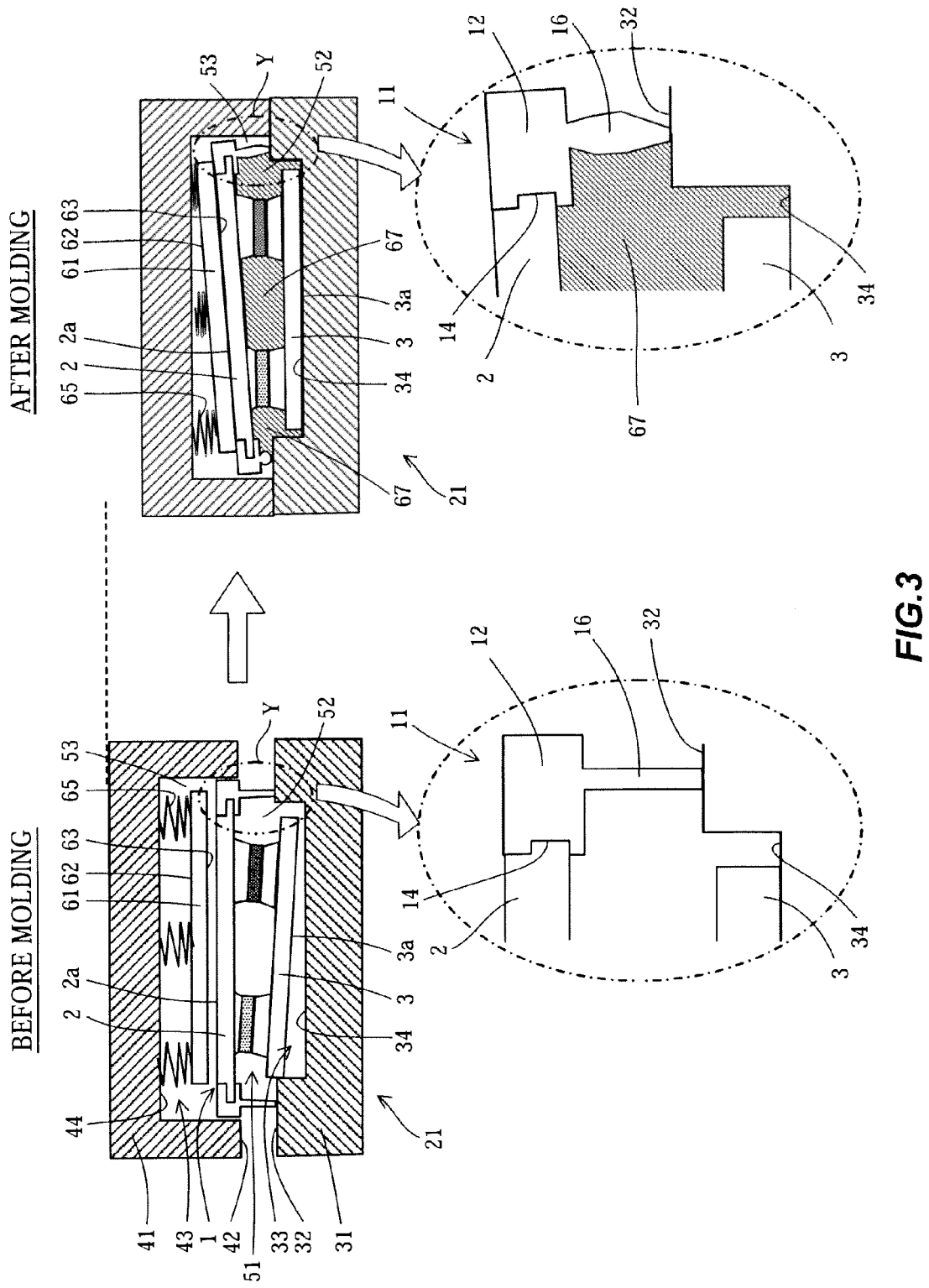
FIG. 3 is a schematic cross-sectional view illustrating a molding apparatus according to the first embodiment before and after the molding, respectively.

FIG. 3 is a schematic cross-sectional view illustrating the molding apparatus 21. A state before the semiconductor device 1 is molded with resin is illustrated on the left side of FIG. 3, and a state after the semiconductor device 1 is molded with resin is illustrated on the right side of FIG. 3. Similarly, in FIG. 3, enlarged views of the Y-portion circled by a one-dotted chain line are illustrated in the lower halves.

The molding apparatus 21 includes a lower mold 31 (second mold) and an upper mold 41 (first mold) having the same rectangular solid shape. A concave portion 33 is formed in the upper face 32 of the lower mold 31 positioned in a vertically downward side. Meanwhile, a concave portion 43 is also formed in the lower face 42 of the upper mold 41 positioned in a vertically upward side. A pair of facing concave portions 33 and 43 constitute a molding chamber 51. The bottom trace 34 of the concave portion of the lower mold 31 and the top face 44 of the concave portion of the upper mold 41 are horizontal planes.

As illustrated in the left side of FIG. 3, the entire semiconductor device 1 is suspended from the lining member 11 inside the concave portion 33 of the lower mold 31 when the semiconductor device 1 is stored in the molding chamber 51, and the leading edge of the protrusion 16 of the lining member 11 abuts on the upper face 32 of the lower mold 31. That is, the vertical length or position of the protrusion 16, the horizontal length and depth of the concave portion 33 of the lower mold 31, and the horizontal length and depth of the concave portion 43 of the upper mold 41 are defined so as to allow the semiconductor device 1 to be suspended from the lining member 11 inside the concave portion 33 of the lower mold 31. In this case, a gap is not substantially generated between the lower end of the protrusion 16 and the upper face 32 of the lower mold 31.

Since the vertical length of the protrusion 16 is equalized around the entire circumference, the left side of the lower electrode 3 is lifted vertically upwardly relative to the right side when the semiconductor device 1 having an inclination deviation is stored in a suspended state inside the concave portion 33 of the lower mold 31. As a result, a vertical interval between the left side of the lower electrode 3 and the bottom face 34 of the concave portion is greater than a vertical interval between the right side of the lower electrode 3 and the bottom face 34 of the concave portion. The vertical length of the protrusion 16 and the depth of the concave portion 33 of the lower mold 31 are defined so as to prevent the lower electrode 3 from abutting on the bottom face 34 of the concave portion even when the semiconductor element 1 having an inclination deviation has a suspended state.

Since a gap is not substantially generated between the lower end of the protrusion 16 and the upper face 32 of the lower mold 31 while the semiconductor device 1 is suspended from the lining member 11, the molding chamber 51 is partitioned into two spaces. That is, the molding chamber 51 is partitioned into two spaces including a space 52 surrounded by the lower mold 31, the upper electrode 2, and the lining member 11 and a space 53 provided in the outer side of the space 52 (upper side in FIG. 3).

Meanwhile, in order to press the semiconductor device 1 stored in the concave portion 33 of the lower mold 31 in a mold closing direction (vertically downwardly in FIG. 3) using the upper mold 41, a template 61 (plate member) having a rectangular tabular shape similar to that of the upper electrode 2 and springs 65 (elastic member) are arranged in the concave portion 43 of the upper mold 41, and the template 61 is substantially horizontally suspended using the spring 65. That is, the upper end of the spring 65 is fixed to the upper face 44 of the concave portion of the upper mold 41, and the lower end of the spring 65 is fixed to the upper face 62 of the template 61. A plurality of springs 65 are provided such that a mold closing force from the upper mold 41 is uniformly applied to the template 61 through the springs 65 when the mold closing is performed for the semiconductor device 1.

The upper mold 41 moves in an opening/closing direction (vertical direction in FIG. 3) with respect to the lower mold 31. As illustrated in the left side of FIG. 3, when molding is performed, first, the template 61 is arranged vertically over the semiconductor device 1 suspended from the lining member 11. Next, mold closing is performed for the semiconductor device 1 by moving the upper mold 41 vertically downwardly until the lower face 42 of the upper mold 41 abuts on the upper face 32 of the lower mold 31. In this case, the protrusion 16 receiving the mold closing force from the upper mold 41 is plastically deformed. Due to the plastic deformation at this moment, the protrusion 16 contracts in a vertical direction and expands in a horizontal direction as illustrated in the right side of FIG. 3 (after molding). That is, the entire lower face 3a of the lower electrode 3 abuts on the bottom face 34 of the concave portion of the lower mold 31, and the lower electrode 3 is stabilized in a horizontal state. In addition, since the lower electrode 3 has a horizontal state, the right side of the upper electrode 2 is lifted vertically upwardly relative to the left side, and the lower face 63 of the template 61 abuts on the entire upper face 2a of the upper electrode 2 in this state.

No gap is generated between the lower end of the protrusion 16 and the upper face 32 of the lower mold 31 even after the protrusion 16 is plastically deformed. That is, even in a mold closing completion state of the semiconductor device 1 illustrated in the right side of FIG. 3, the molding chamber 51 is partitioned into two spaces including a space 52 (referred to as a "first space") surrounded by the lower mold 31, the upper electrode 2, and the lining member 11 and a space 53 (referred to as a "second space") arranged in the outer side of the space 52. In addition, in a suspended state before the mold closing, it does not matter if a gap exists between the lower end of the protrusion 16 and the upper face 32 of the lower mold 31. However, when the mold closing is completed, it is necessary to be careful not to generate a gap between the lower end of the protrusion 16 and the upper face 32 of the lower mold 31 due to the reason described below.

The first space 52 partitioned in this way is provided with a molding resin supply path (not illustrated) opened in the first space from the front or rear side of the drawing in FIG. 3. In the mold closing completion state of the semiconductor device 1 illustrated in the right side of FIG. 3, as resin (molding resin) 67 capable of being pressedly injected into the first space 52 is supplied through the molding resin supply path, the resin 67 is filled in the first space, that is, the gap (space) between a pair of the electrodes 2 and 3. In this case, if there is a gap between the lower end of the protrusion 16 and the upper face 32 of the lower mold 31, the gap may serve as a path where the resin 67 leaks. However, according to the present embodiment, no gap is generated between the lower end of the protrusion 16 and the upper face 32 of the lower mold 31 even after the protrusion 16 is plastically deformed. For this reason, the resin 67 horizontally directed to the outer side inside the first space 52 is obstructed by the plastically deformed protrusion 16. Therefore, the resin 67 does not leak to the second space 53 positioned in the outer side of the first space 52.

Since the lower face 3a of the lower electrode 3 abuts on the bottom face 34 of the concave portion of the lower mold 31 across the entire surface, the resin 67 does not leak through the gap between the lower face 3a of the lower electrode 3 and the bottom face 34 of the concave portion of the lower mold 31.

Here, effects and advantages of the present embodiment will be described.

According to the present embodiment, in the molding apparatus 21 having the upper mold 41 (first mold) and the lower mold 31 (second mold constituting the molding chamber with the first mold), the upper mold 41 includes the template 61 (plate member) that moves in a mold closing direction and makes contact with the upper face 2a (one face of the molding target) of the upper electrode 2 of the semiconductor device 1 and the spring 65 (elastic member) that presses the template 61 toward the semiconductor device 1, and the protrusion extending toward the lower mold 31 is provided in the circumferential edge portion of the upper face 2a (one face of the molding target) of the upper electrode 2 of the semiconductor device 1, so that the protrusion 16 is plastically deformed after the protrusion 16 abuts on the lower mold 31 at the time of mold closing for the semiconductor device 1. According to the present embodiment, since the protrusion 16 is plastically deformed by the load applied at the time of mold closing for the semiconductor device 1 (molding target) having a resin molding space, it is possible to block the path where the resin 67 leaks while an inclination deviation of the semiconductor device 1 is absorbed. As a result, it is possible to prevent the resin 67 from leaking to the second space 53 positioned in the outer side of the first space 52.

According to the present embodiment, the semiconductor device 1 having the tabular electrodes 2 and 3 in both sides of the power elements 4 and 5 is a molding target. The circumferential edge portion of one face of the molding target is the circumferential edge portion of the upper electrode 2 (one of the electrodes), and the lower electrode 3 (the other electrode) and the lower mold 31 (second mold) abut on each other when the mold closing for the semiconductor device 1 is completed. As a result, it is possible to prevent the resin 67 from leaking through the gap between the lower face 3a of the lower electrode 3 and the bottom face 34 of the concave portion of the lower mold 31.

In the apparatus of the related art (refer to W4 of FIG. 1 in JP 2007-320102A) in which a lead frame is provided around the molding target for resin leakage prevention and conveyance convenience, it is necessary to remove the lead frame in a finish stage. Meanwhile, according to the present embodiment, the plastically deformed lining member 11 does not affect performance of the semiconductor device 1 even when the lining member 11 remains in the semiconductor device 1. Therefore, it is not necessary to remove the lining member 11 after the molding. As a result, it is possible to reduce the number of processes in comparison with the apparatus of the related art.

Figure 4:
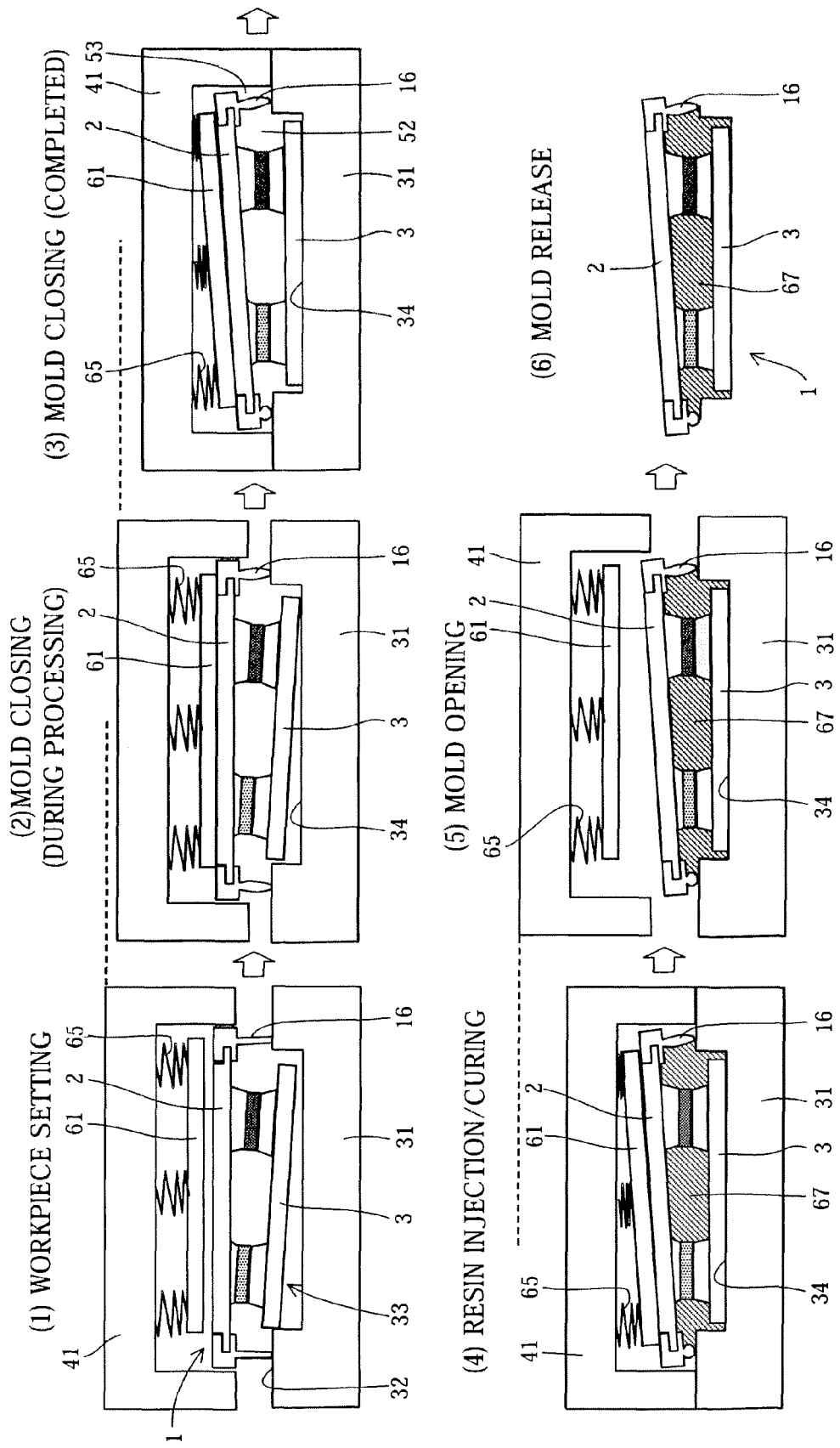
FIG. 4 is a process diagram illustrating a method of molding a semiconductor device having an inclination deviation according to the first embodiment.

FIG. 4 is a process diagram illustrating a method of molding the semiconductor device 1 having an inclination deviation, in which five processes are dividingly illustrated, including a workpiece setting process, a mold closing process, a resin injection/curing process, a mold opening process, and a mold release process.

First, in the workpiece setting process shown in (1) of FIG. 4, the semiconductor device 1 as a workpiece is stored in the molding chamber, and the protrusion 16 is set to abut on the upper face 32 of the lower mold 31, so that the semiconductor device 1 is suspended inside the concave portion 33 of the lower mold 31. In this case, the protrusion 16 extends toward the lower mold 31. The template 61 is set vertically over the upper electrode 2.

In the mold closing process shown in (2) of FIG. 4, the upper mold 41 moves in a mold closing direction (vertically downwardly in FIG. 4) until the lower face 42 of the upper mold 41 abuts on the upper face 32 of the lower mold 31. This mold closing causes the template 61 to downwardly press the upper electrode 2 so that the entire lower face of the template 61 abuts on the upper face 2a of the upper electrode 2, and then, the right end of the lower electrode 3 abuts on the bottom face 34 of the concave portion of the lower mold 31. In addition, as the upper mold 41 moves in the mold closing direction, a uniform load is vertically downwardly applied to the protrusion 16 through the template 61, and this load generates a vertically upward reactive force from the lower mold 31 in the lower end of the protrusion 16. The magnitude of the reactive force is equal to that of the mold closing force. As this reactive force is received, the protrusion 16 is plastically deformed. That is, a load distribution (reactive force distribution) inclined to the protrusion 16 is applied depending on the inclination of the upper and lower electrodes 2 and 3 to generate plastic deformation. As a result, when the mold closing process is completed as illustrated shown in (3) of FIG. 4, the entire lower face 3a of the lower electrode 3 abuts on the bottom face 34 of the concave portion of the lower mold 31, and the first space 52 is partitioned by the lower mold 31, the upper electrode 2 of the semiconductor device 1, and the lining member 11 inside the molding chamber 51.

In the resin injection/curing process shown in (4) of FIG. 4, the resin 67 is injected into the first space 52 and fills the first space 52. Then, the filled resin 67 is thermally cured.

In the mold opening process shown in (5) of FIG. 4, in order to perform the mold opening for the semiconductor device 1 after curing of the resin 67, the upper mold 41 moves in a mold opening direction (vertically upwardly in FIG. 4).

In the mold release process shown in (6) of FIG. 4, the semiconductor device 1 is extracted from the molding apparatus 21 (mold release), and the molding is terminated.

Second Embodiment

Figure 5:
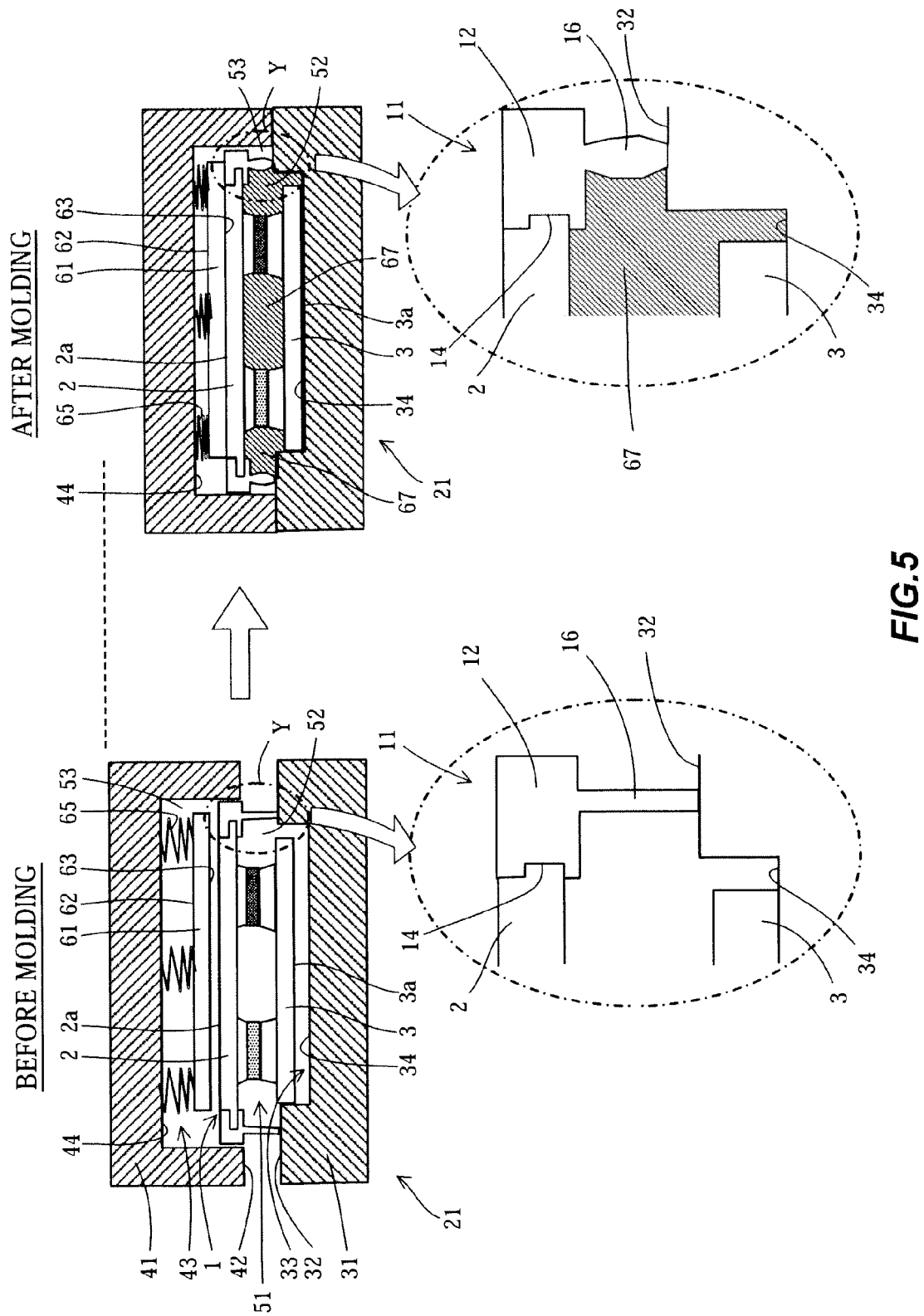
FIG. 5 is a schematic cross-sectional view illustrating a molding apparatus according to a second embodiment before and after the molding, respectively.

FIG. 5 is a schematic cross-sectional view illustrating a molding apparatus 21 according to the second embodiment. A state before the semiconductor device 1 is molded with resin is illustrated in the left side of FIG. 5, and a state after the semiconductor device 1 is molded with resin is illustrated in the right side of FIG. 5. Similarly, in FIG. 5, enlarged views of the Y-portion circled by a one-dotted chain line are illustrated in the lower halves, where like reference numerals denote like elements as in FIG. 3 of the first embodiment.

The first embodiment focuses on a semiconductor device 1 having an inclination deviation, whereas the second embodiment focuses on a semiconductor device 1 having a thickness deviation. Here, the "thickness deviation" means that a vertical thickness of the entire semiconductor device 1 including upper and lower electrodes 2 and 3 is deviated for each semiconductor device 1. For example, as illustrated in FIG. 5, a vertical thickness between the left end of the upper face 2a of the upper electrode 2 and the left end of the lower face 3a of the lower electrode 3 is equal to a vertical thickness between the right end of the upper face 2a of the upper electrode 2 and the right end of the lower face 3a of the lower electrode 3. That is, the vertical thickness between the upper face of the upper electrode 2 and the lower face of the lower electrode 3 is equalized. Therefore, the semiconductor device 1 illustrated in FIG. 5 does not suffer from an inclination deviation. However, there may be a deviation in the vertical thickness between the upper face of the upper electrode 2 and the lower face of the lower electrode 3 (a thickness deviation may be generated) for each semiconductor device 1.

Even in a case where the semiconductor device 1 having a thickness deviation is used as a target, the semiconductor device 1 is stored in the molding chamber 51, and the lower end of the protrusion 16 of the lining member 11 abuts on the upper face 32 of the lower mold 31, so that the entire semiconductor device 1 is suspended from the lining member 11 inside the concave portion 33 of the lower mold 31 as illustrated in the left side of FIG. 5. That is, the vertical length or position of the protrusion 16, the horizontal length and depth of the concave portion 33 of the lower mold 31, and the horizontal length and depth of the concave portion 43 of the upper mold 41 are defined such that the semiconductor device 1 is suspended from the lining member 11 inside the concave portion 33 of the lower old 31. In this case, a gap is not substantially generated between the lower end of the protrusion 16 and the upper face 32 of the lower mold 31.

Even in a case where the semiconductor device 1 having a thickness deviation is used as a target, a gap is not substantially generated between the lower end of the protrusion 16 and the upper face 32 of the lower mold 31 while the semiconductor device 1 is suspended from the protrusion 16. Therefore, the molding chamber 51 is partitioned into two spaces. That is, the molding chamber 51 is divided into two spaces including the first space 52 surrounded by the lower mold 31, the upper electrode 2 of the semiconductor device 1, and the lining member 11 and the second space 53 provided in the outer side of the space 52.

The effects and advantages of the second embodiment are similar to those of the first embodiment. That is, according to the second embodiment, the protrusion 16 is plastically deformed by the load applied when the mold closing is performed for the semiconductor device 1 (molding target) having a resin molding space, so that it is possible to absorb a thickness deviation in the semiconductor device 1 and block the path where the resin 67 leaks. As a result, it is possible to prevent the resin 67 from leaking to the second space 53 provided in the outer side of the first space 52.

Figure 6:
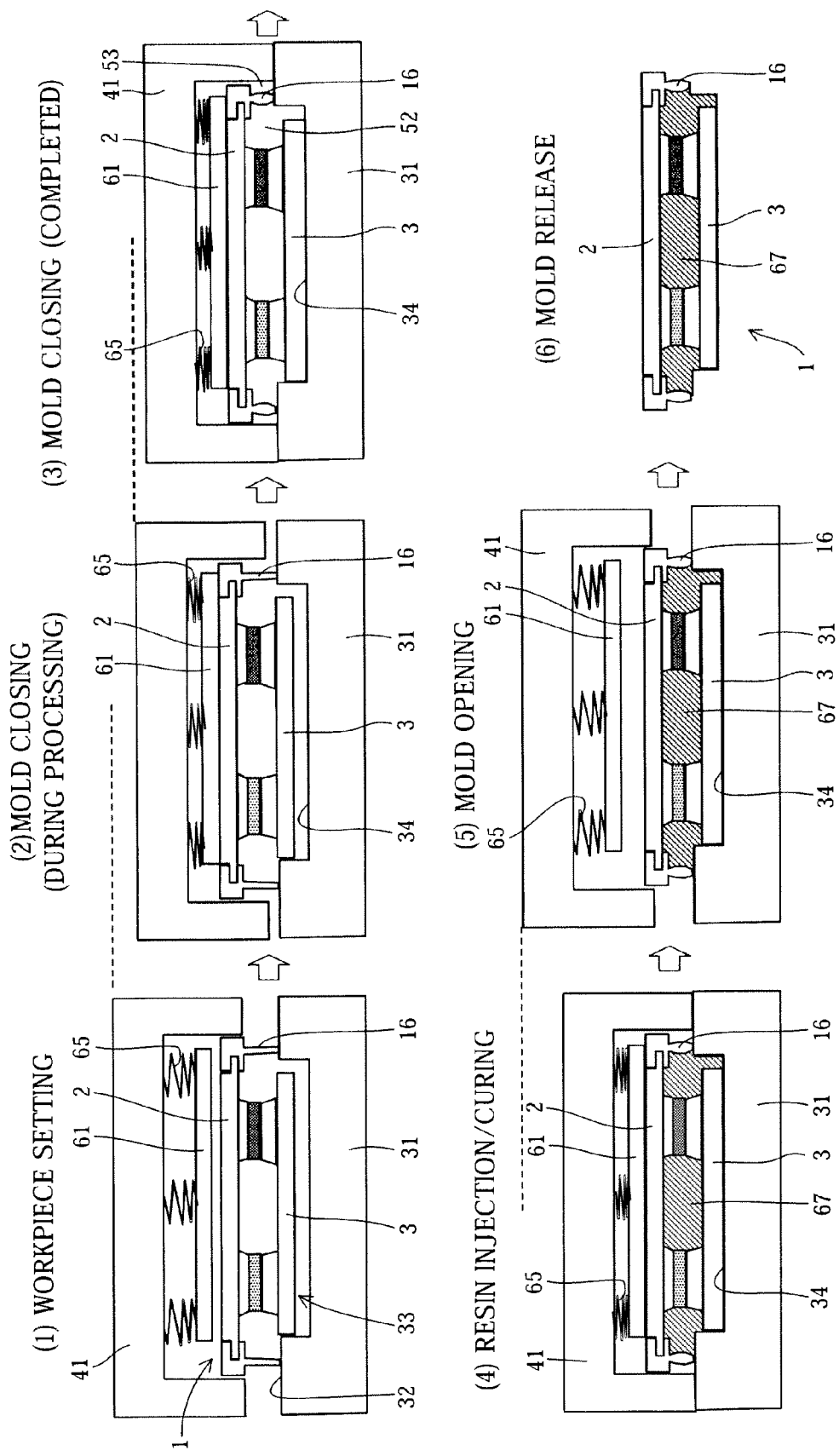
FIG. 6 is a process diagram illustrating a method of molding a semiconductor device having a thickness deviation according to the second embodiment.

FIG. 6 is a process diagram illustrating a resin molding method for the semiconductor device 1 having a thickness deviation, in which five processes are dividingly illustrated, including a workpiece setting process, a mold closing process, a resin injection/curing process, a mold opening process, and a mold release process, where like reference numerals denote like elements as in FIG. 4.

In the workpiece setting process shown in (1) of FIG. 6, the semiconductor device 1 as a workpiece is stored in the molding chamber, and the protrusion 16 is set to abut on the upper face 32 of the lower mold 31, so that the semiconductor device 1 is suspended inside the concave portion 33 of the lower mold 31. In this case, the protrusion 16 extends toward the lower mold 31. The template 61 is set vertically over the upper electrode 2.

In the mold closing process shown in (2) of FIG. 6, the upper mold 41 moves in a mold closing direction (vertically downwardly in FIG. 6) until the lower face 42 of the upper mold 41 abuts on the upper face 32 of the lower mold 31. This mold closing causes the template 61 to downwardly press the upper electrode 2 so that the entire lower face of the template 61 abuts on the upper face 2a of the upper electrode 2, and then, a space is also generated between the lower face 3a of the lower electrode 3 and the bottom face 34 of the convex portion of the lower mold 31 in the middle of the mold closing process. In addition, as the upper mold 41 moves in the mold closing direction, a uniform load is vertically downwardly applied to the protrusion 16 through the template 61, and this load generates a vertically upward reactive force from the lower mold 31 in the lower end of the protrusion 16. The magnitude of the reactive force is equal to that of the mold closing force. The protrusion 16 is plastically deformed by receiving this reactive force. That is, a uniform load distribution (reactive force distribution) is applied to the protrusion 16 to cause plastic deformation. As a result, when the mold closing process is completed as illustrated in (3) of FIG. 6, the entire lower face 3a of the lower electrode 3 abuts on the bottom face 34 of the concave portion of the lower mold 31, and the first space 52 is partitioned by the lower mold 31, the upper electrode 2 of the semiconductor device 1, and the lining member 11 inside the molding chamber 51.

In the resin injection/curing process shown in (4) of FIG. 6, the resin 67 is injected into the first space 52 and fills the first space 52. Then, the filled resin 67 is thermally cured.

In the mold opening process shown in (5) of FIG. 6, in order to perform the mold opening for the semiconductor device 1 after curing of the resin 67, the upper mold 41 moves in a mold opening direction (vertically upwardly in FIG. 6).

In the mold release process shown in (6) of FIG. 6, the semiconductor device 1 is extracted from the molding apparatus 21 (mold release), and the molding is terminated.

Third Embodiment

Figure 7:
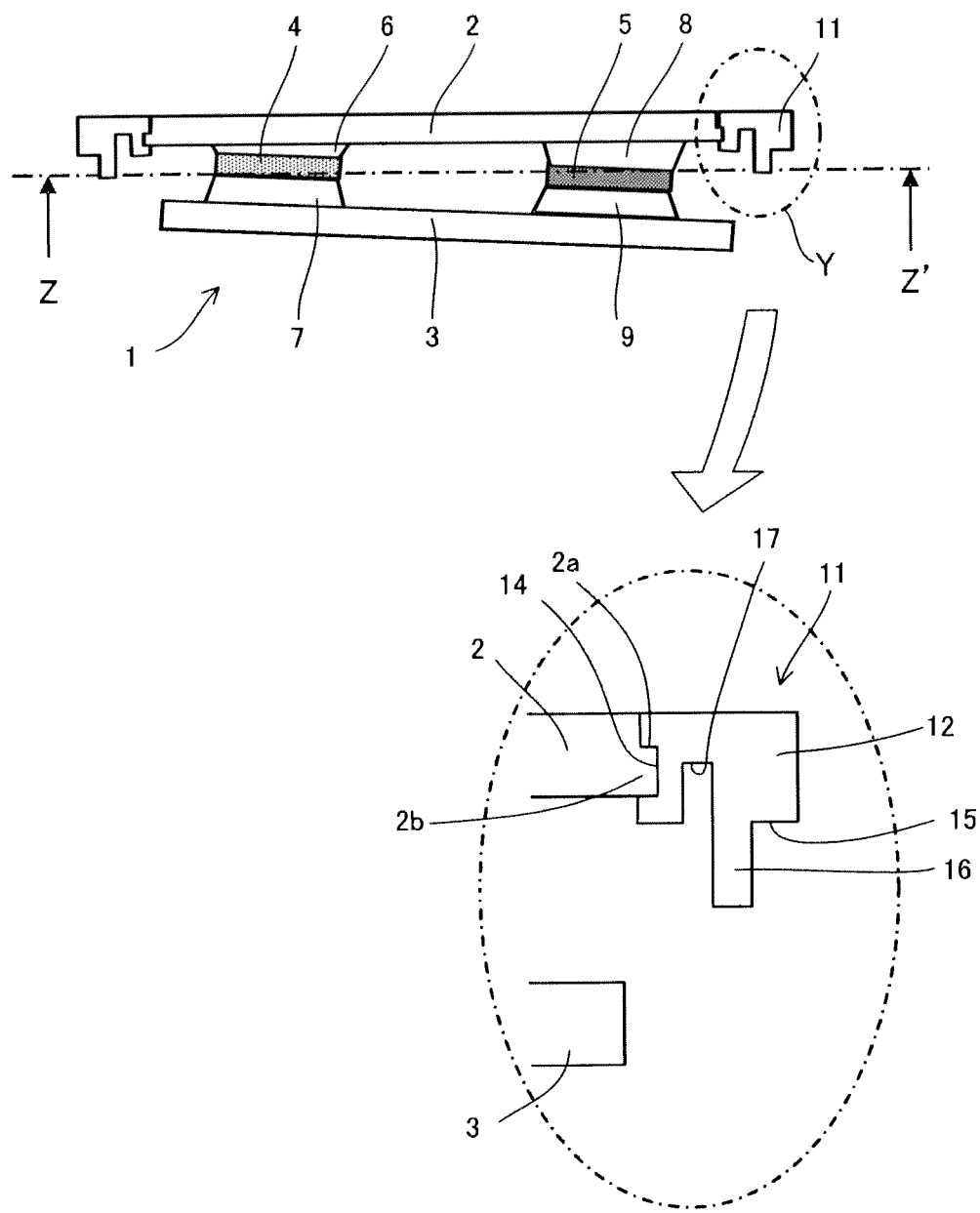
FIG. 7 is a schematic longitudinal cross-sectional view illustrating a semiconductor device according to a third embodiment.
Figure 8:
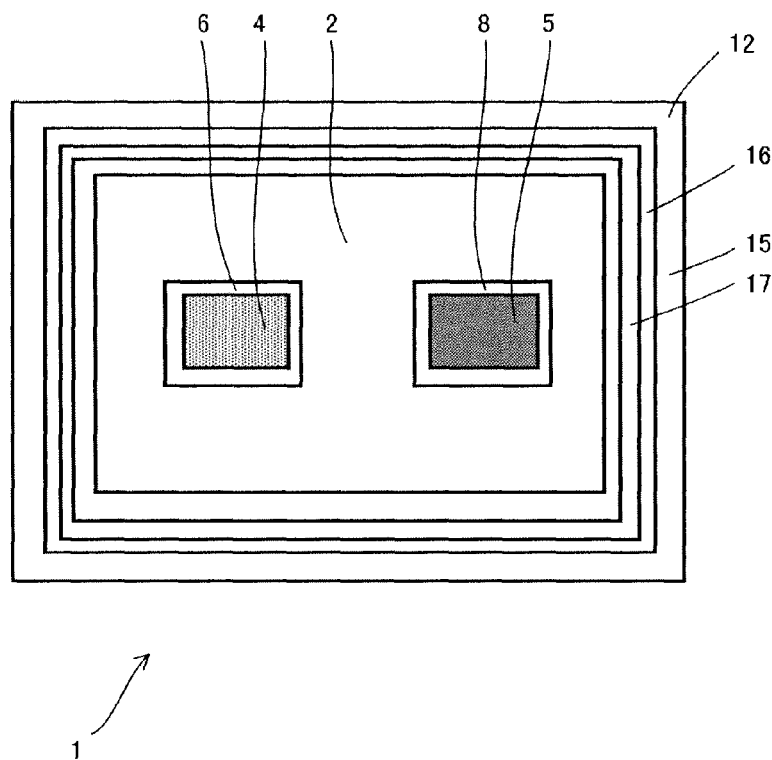
FIG. 8 is a cross-sectional view taken along a line Z-Z' of FIG. 7.

FIG. 7 is a schematic longitudinal cross-sectional view illustrating a semiconductor device 1 according to the third embodiment, and FIG. 8 is a cross-sectional view taken along a line Z-Z' of the semiconductor device 1 of FIG. 7. In FIG. 7, an enlarged view of the Y-portion circled by a one-dotted chain line is illustrated in the lower half. In FIGS. 7 and 8, like reference numerals denote like elements as in FIGS. 1 and 2 of the first embodiment. Similar to the first embodiment, the third embodiment focuses on the semiconductor device 1 having an inclination deviation. In the third embodiment, in order to emphasize a fact that the invention is not limited to the semiconductor device having an inclination deviation, the semiconductor device 1 having a thickness deviation instead of the semiconductor device having an inclination deviation is illustrated in FIG. 9.

As illustrated in FIG. 7, according to the third embodiment, a trench 17 opened vertically downwardly to adjoin the inner circumference side of the protrusion 16 is provided in the lower face 15 of the frame portion of the lining member 11. As illustrated in FIG. 8, the trench 17 also surrounds the circumferential edge of the upper electrode 2.

Figure 9:
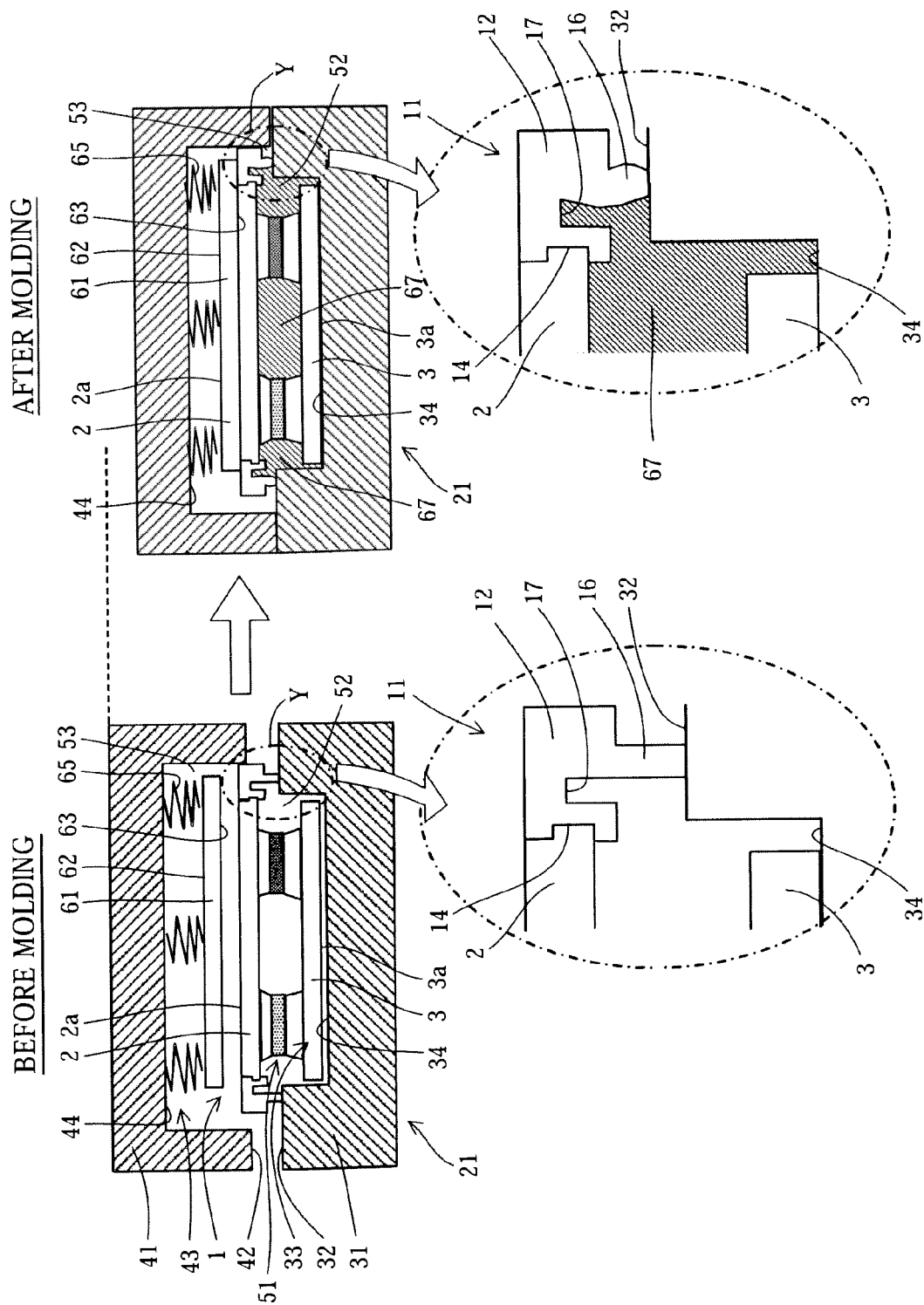
FIG. 9 is a schematic cross-sectional view illustrating a molding apparatus according to the third embodiment before and after the molding, respectively.

FIG. 9 is a schematic cross-sectional view illustrating the molding apparatus 21 according to the third embodiment. A state before the resin molding is performed for the semiconductor device 1 is illustrated in the left side of FIG. 9, and a state after the resin molding is performed for the semiconductor device 1 is illustrated in the right side of FIG. 9. Similarly, in FIG. 9, enlarged views of the Y-portion circled by a one-dotted chain line are illustrated in the lower halves, where like reference numerals denote like elements as in FIG. 3 of the first embodiment.

The plastic deformation method of the protrusion 16 at the time of molding for the semiconductor device 1 is different from that of the first embodiment. That is, since the trench 17 is provided to adjoin the inner circumference side of the protrusion 16, plastic deformation is generated such that the protrusion 16 in the trench 17 side bulges out toward the inner side of the trench 17 at the time of mold closing for the semiconductor device 1 as illustrated in the right side of FIG. 9. For this reason, by filling the resin 67 in the trench 17 and curing the resin 67, a portion of the resin 67 filled in the trench 17 serves as an anchor. Typically, an anchor is used to obtain adhesion with a fixed member such as a deck when the anchor is vertically downwardly driven to the fixed member. Here, a portion of the resin 67 filled in the trench 17 corresponds to an anchor which is vertically upwardly driven.

In this manner, according to the third embodiment, since the trench 17 is provided to adjoin the inner circumference side of the protrusion 16, the resin 67, which is filled in the trench 17 and is cured, has an anchoring effect, and adhesion of the resin 67 is improved in both the vertical and horizontal directions. In addition, it is possible to obtain an adhesion effect even when a bonding of a material of the protrusion 16 and the resin 67 are not satisfactory.

While the present invention has been described in detail with reference to the accompanying drawings hereinbefore, it is not intended to limit the invention to such specific configurations. Various modifications, changes, and the like may be possible without departing from the spirit and scope of the invention and equivalents thereof as disclosed in claims. For example, the configurations of FIGS. 3, 5, and 9 may be vertically reversed.

This application claims priority based on JP2010-290295, filed with the Japan Patent Office on Dec. 27, 2010, the entire contents of which are incorporated into this specification by reference.

The invention claimed is:

1. A method of molding a molding target including a plurality of semiconductor elements, a first tabular electrode coupled to one face side of the plurality of semiconductor elements, a second tabular electrode coupled to the other face side of the plurality of semiconductor elements, and a protrusion extending toward the second electrode in a circumferential edge portion of the first electrode, the method comprising:
    arranging the molding target in a molding chamber constituted by a hollow portion of a first mold and a hollow portion of a second mold;
    performing mold closing for the molding target by moving the first mold in a mold closing direction while the protrusion is plastically deformed;
    injecting resin into a space partitioned by the second mold, the first electrode, the second electrode, and the protrusion after the mold closing is completed;
    curing the injected resin; and
    performing mold release for the molding target by performing mold opening after the resin is cured.

* * * * *